(12) United States Patent
Huang et al.

(10) Patent No.: US 10,679,924 B2
(45) Date of Patent: Jun. 9, 2020

(54) SEMICONDUCTOR DEVICE WITH ANTENNA INTEGRATED

(71) Applicant: WIN Semiconductors Corp., Tao Yuan (TW)

(72) Inventors: Chih-Wen Huang, Taoyuan (TW); Jui-Chieh Chiu, Taoyuan (TW)

(73) Assignee: WIN Semiconductors Corp., Tao Yuan (TW)

(*) Notice: Subject to any disclaimer, the term of this patent is extended or adjusted under 35 U.S.C. 154(b) by 0 days.

(21) Appl. No.: 15/912,546

(22) Filed: Mar. 5, 2018

(65) Prior Publication Data

US 2019/0273031 A1 Sep. 5, 2019

(51) Int. Cl.
*H01L 23/48* (2006.01)
*H01L 23/31* (2006.01)
*H01L 23/66* (2006.01)
*H01Q 1/22* (2006.01)
*H01L 23/00* (2006.01)

(52) U.S. Cl.
CPC ........ *H01L 23/481* (2013.01); *H01L 23/3157* (2013.01); *H01L 23/48* (2013.01); *H01L 23/66* (2013.01); *H01Q 1/2283* (2013.01); *H01L 24/13* (2013.01); *H01L 24/16* (2013.01); *H01L 2223/6677* (2013.01); *H01L 2224/1319* (2013.01); *H01L 2224/13101* (2013.01); *H01L 2224/16225* (2013.01)

(58) Field of Classification Search
CPC .... H01L 23/481; H01L 23/3157; H01L 23/66
See application file for complete search history.

(56) References Cited

U.S. PATENT DOCUMENTS

| 5,936,280 | A | 8/1999 | Liu | |
|---|---|---|---|---|
| 6,549,413 | B2 | 4/2003 | Karnezos | |
| 6,809,421 | B1 | 10/2004 | Hayasaka | |
| 7,829,975 | B2 | 11/2010 | Hayasaka | |
| 7,977,798 | B2 | 7/2011 | Dertinger | |
| 8,110,899 | B2* | 2/2012 | Reed | H01L 25/0652 257/621 |
| 8,169,054 | B2 | 5/2012 | Oikawa | |
| 8,174,093 | B2 | 5/2012 | Hayasaka | |
| 8,629,542 | B2 | 1/2014 | Leedy | |
| 8,916,468 | B2 | 12/2014 | Ochimizu | |
| 9,252,077 | B2 | 2/2016 | Molzer | |
| 9,349,673 | B2 | 5/2016 | Yoda | |
| 9,543,204 | B2 | 1/2017 | Saeki | |
| 9,647,196 | B2* | 5/2017 | Bauer | B81C 1/00301 |
| 9,748,228 | B2* | 8/2017 | Lee | H01L 24/17 |
| 2005/0133906 | A1* | 6/2005 | Woodall | H01L 23/3677 257/707 |
| 2006/0198147 | A1* | 9/2006 | Ge | F21V 3/00 362/294 |

(Continued)

*Primary Examiner* — Ida M Soward
(74) *Attorney, Agent, or Firm* — Winston Hsu

(57) ABSTRACT

A semiconductor device is disclosed. The semiconductor device includes a substrate; an active circuit portion including at least an active component and formed on a topside of the semiconductor device; and a radiating metal sheet formed on a backside of the semiconductor device. A hole is formed within the substrate and the hole penetrates through the substrate. The active circuit portion and the radiating metal sheet are coupled through the hole.

8 Claims, 4 Drawing Sheets

(56) References Cited

U.S. PATENT DOCUMENTS

| | | | |
|---|---|---|---|
| 2008/0224169 A1* | 9/2008 | Wu | H01L 33/486 257/99 |
| 2009/0045487 A1 | 2/2009 | Jung | |
| 2009/0289343 A1 | 11/2009 | Chiu | |
| 2010/0033935 A1* | 2/2010 | Chainer | H01L 23/40 361/718 |
| 2011/0019126 A1* | 1/2011 | Choi | H05K 1/0206 349/61 |
| 2011/0104846 A1* | 5/2011 | Hsu | H01L 23/481 438/54 |
| 2011/0133333 A1 | 6/2011 | Kwon | |
| 2012/0104574 A1 | 5/2012 | Boeck | |
| 2012/0175774 A1* | 7/2012 | West | H01L 23/3128 257/751 |
| 2013/0015564 A1 | 1/2013 | Matsuki | |
| 2014/0071021 A1 | 3/2014 | Liu | |
| 2014/0176368 A1* | 6/2014 | Kamgaing | H01Q 21/0006 343/700 MS |
| 2014/0225246 A1* | 8/2014 | Henderson | H01L 21/50 257/691 |
| 2014/0225248 A1* | 8/2014 | Henderson | H01L 21/50 257/712 |
| 2014/0247195 A1 | 9/2014 | Yen | |
| 2015/0111317 A1* | 4/2015 | Hasebe | H01L 22/14 438/15 |
| 2018/0151475 A1 | 5/2018 | Oshige | |
| 2018/0190617 A1* | 7/2018 | Chew | H01L 25/50 |
| 2018/0350942 A1* | 12/2018 | Bartley | H01L 23/5226 |
| 2019/0058005 A1* | 2/2019 | Pesetski | H01L 27/18 |

* cited by examiner

SEMICONDUCTOR DEVICE WITH ANTENNA INTEGRATED

BACKGROUND OF THE INVENTION

1. Field of the Invention

The present invention relates to a semiconductor device with antenna integrated, and more particularly, to a semiconductor device with antenna integrated capable of avoiding affection from printed circuit board (PCB).

2. Description of the Prior Art

As technology evolves, wireless communication is an important part of human life. Various electronic devices, such as smart phones, smart wearable devices, tablets, etc., utilize wireless radio frequency (RF) devices to transmit and receive wireless RF signals, and front end module (FEM) is widely used in electronic devices.

Wire bonding is widely used in traditional FEM package. As the RF increases, wire bonding is not suitable for high frequency application, since the bonding wire would have contact with the molding compound and inductive effect is induced, such that RF performance is degraded. To bypass the bonding wire, flip chip package technology has been developed.

In addition, antenna integrated in semiconductor die or semiconductor package has been developed to reduce a size of the FEM. In the prior art, antenna may be disposed on a topside of a semiconductor substrate/device. When the semiconductor device may be assembled on a printed circuit board (PCB) using flip chip, bumping or hot via technology, the antenna is close to the PCB, and the PCB would affect the radiation performance on the PCB.

Please refer to FIG. 4, which is a schematic diagram of a semiconductor device 40 of US patent publication no. 2012/0104574. The semiconductor device 40, a wafer level chip scale package (WLCSP), comprises a die 400 and an antenna 402. The antenna 402 is formed on a topside on which the die 400 is disposed. The semiconductor device 40 is flipped when it is assembled on a PCB 43 using the flip chip technology, i.e., the semiconductor device 40 is coupled to the PCB 43 through bumps 41. That is, the antenna 402 is close to the PCB 43, and thus, the PCB 43 would affect radiation performance of the antenna 402, which degrades RF performance.

Therefore, it is necessary to improve the prior art.

SUMMARY OF THE INVENTION

It is therefore a primary objective of the present invention to provide a semiconductor device with antenna integrated capable of avoiding affection from printed circuit board (PCB), to improve over disadvantages of the prior art.

An embodiment of the present invention discloses a semiconductor device comprising a substrate; an active circuit portion comprising at least an active component and formed on a topside of the semiconductor device; and a radiating metal sheet formed on a backside of the semiconductor device. A hole is formed within the substrate and the hole penetrates through the substrate. The active circuit portion and the radiating metal sheet are coupled through the hole.

An embodiment of the present invention further discloses a semiconductor device comprising a substrate; an active circuit portion, disposed on the substrate; a dielectric portion, disposed on the active circuit portion, wherein a hole is formed within the dielectric portion and the hole penetrates through the dielectric portion; and a radiating metal sheet, disposed on the dielectric portion; wherein the active circuit portion and the radiating metal sheet are coupled through the hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
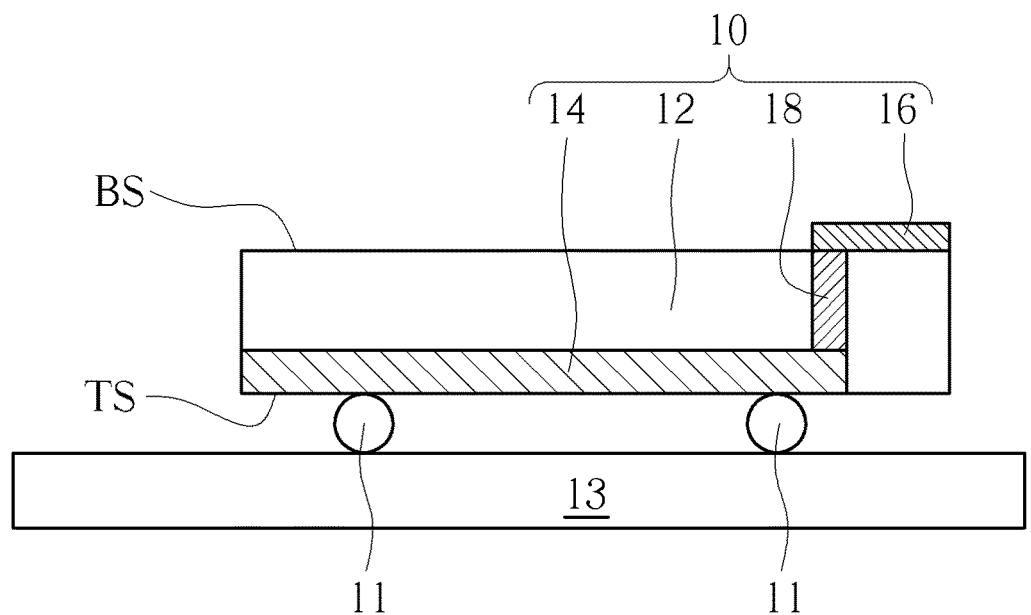
FIG. 1 is a schematic diagram of a semiconductor device according to an embodiment of the present invention.

FIG. 1 is a schematic diagram of a semiconductor device 10 according to an embodiment of the present invention. The semiconductor device 10 may be simply a die. The semiconductor device 10 may be flipped such that a topside TS of the semiconductor device 10 is downward and a backside BS of the semiconductor device 10 is upward. For example, the semiconductor device 10 may be disposed/assembled on the PCB 13 by a flip chip method, i.e., the semiconductor device 10 may be coupled to (metal lines of) a printed circuit board (PCB) 13 via bumps 11.

The semiconductor device 10 comprises a substrate 12, an active circuit portion 14 and a radiating metal sheet 16. The substrate 12 may be a silicon substrate, a SiGe (Silicon Germanium) or a GaAs (Gallium Arsenide) substrate. Within the substrate 12, a hole 18 is formed. The hole 18 may be a hot via (HV) or a through-silicon via (TSV). The active circuit portion 14, formed on the topside TS of the semiconductor device 10, comprises active circuitry, e.g., power amplifier (PA) or low noise amplifier (LNA), of the semiconductor device 10. In other words, the active circuit portion 14 comprises at least an active component, where the active component may be a high electron mobility transistor (HEMT), a heterojunction bipolar transistor (HBT), a bipolar junction transistor (BJT) or a field effect transistor (FET), etc. The radiating metal sheet 16, configured to radiate electromagnetic wave and to function as an antenna, is formed on the backside BS of the semiconductor device 10. The radiating metal sheet 16 and the active circuit portion 14 are coupled through the hole 18.

Notably, the backside BS is opposite to the topside TS of the semiconductor device 10, and the topside TS represents the side of the semiconductor device 10 on which the active circuit portion 14 is disposed.

Figure 4:
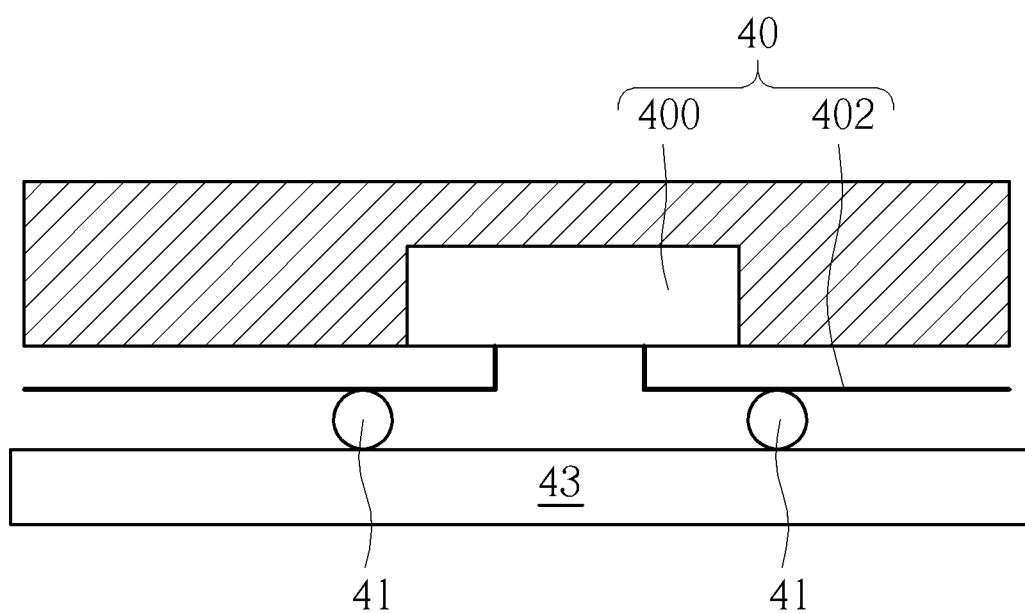
FIG. 4 is a schematic diagram of a semiconductor device 40 in the prior art.

As can be seen from FIG. 1, when the semiconductor device 10 is disposed on the PCB 13 using the flip chip method, the radiating metal sheet 16, formed on the backside BS of the semiconductor device 10, is farther from the PCB 13, compared to the semiconductor device 40 in FIG. 4.

Therefore, the affection brought by the PCB 13 on the radiation performance of the radiating metal sheet 16 would be alleviated, such that the semiconductor 10 would have better radio frequency (RF) performance.

Figure 2:
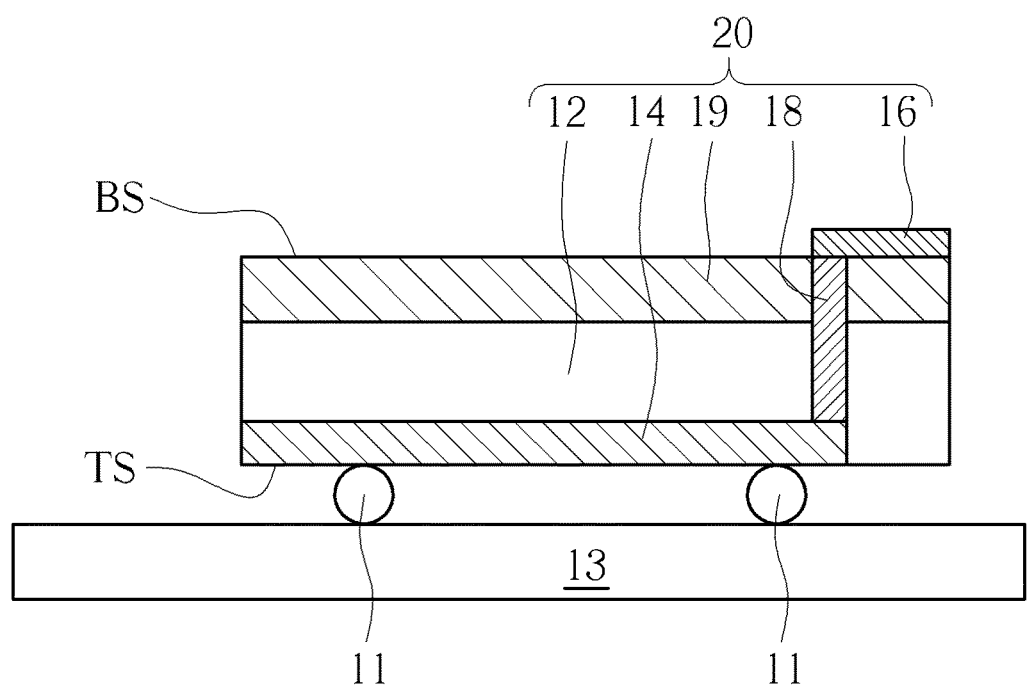
FIG. 2 is a schematic diagram of a semiconductor device according to an embodiment of the present invention.

In addition, a dielectric portion may be disposed between the substrate and the radiating metal sheet (i.e., the antenna). FIG. 2 is a schematic diagram of a semiconductor device 20 according to an embodiment of the present invention. The semiconductor device 20 is similar to the semiconductor device 10, and thus, the same components are denoted by the same notations. The semiconductor device 20 may be a waver level chip scale package (WLCSP). Different from the semiconductor device 10, the semiconductor device 20 further comprises a dielectric portion 19. The dielectric portion 19 is disposed/formed between the substrate 12 and the radiating metal sheet 16. In the semiconductor device 20, the hole 18 penetrates through both the substrate 12 and the dielectric portion 19, such that the radiating metal sheet 16 and the active circuit portion 14 are able to be coupled through the hole 18.

Figure 3:
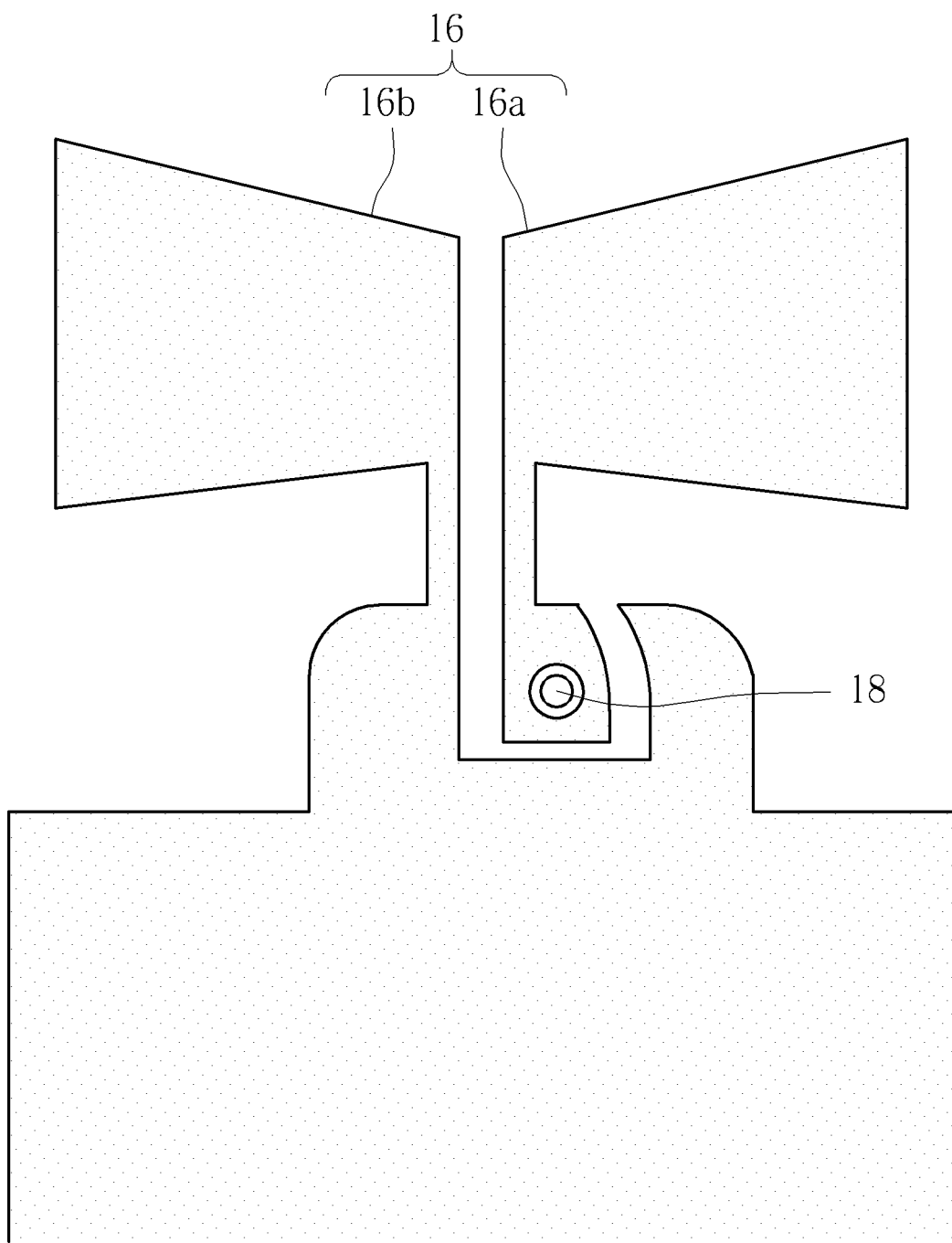
FIG. 3 is a schematic diagram of a radiating metal sheet according to an embodiment of the present invention.

Notably, the embodiments stated in the above are utilized for illustrating the concept of the present invention. Those skilled in the art may make modifications and alterations accordingly, and not limited herein. For example, a shape of the radiating metal sheet 16 is not limited. FIG. 3 is a schematic diagram of the radiating metal sheet 16 according to an embodiment of the present invention. FIG. 3 may be a bottom view of the semiconductor device 10 or 20, illustrating the backside BS of the semiconductor device 10 or 20. As shown in FIG. 3, the radiating metal sheet 16 comprises a first radiating part 16*a* and a second radiating part 16*b*. In an embodiment, the hole 18 is only formed to connect the first radiating part 16*a*, which means that the active circuit portion 14 is only coupled to the first radiating part 16*a*. The radiating part 16*b* may be connected to a ground or a backside metal. In this case, balun may be spared and a size of the semiconductor device may be further reduced.

Figure 5:
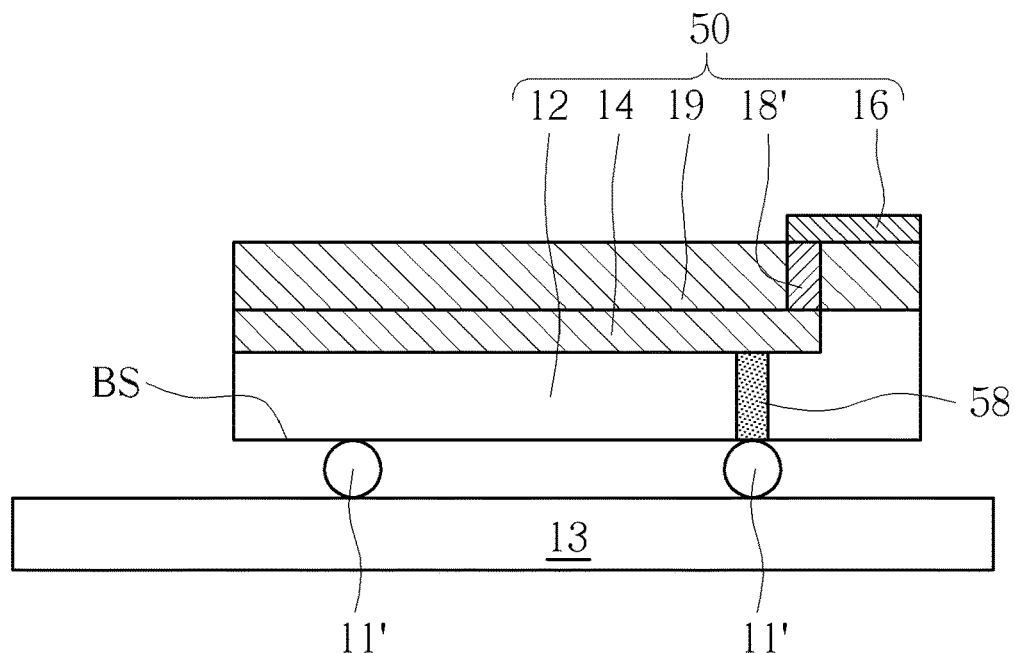
FIG. 5 is a schematic diagram of a semiconductor device according to an embodiment of the present invention.

In addition, the semiconductor devices 10 and 20 in FIG. 1 and FIG. 2, respectively, are assembled by the flip chip method on the PCB 13, which is not limited thereto. FIG. 5 is a schematic diagram of a semiconductor device 50 according to an embodiment of the present invention. The semiconductor device 50 is similar to the semiconductor device 20, and thus, the same components are denoted by the same notations. Different from the semiconductor device 20, the semiconductor device 50 is not assembled by the flip chip method on the PCB 13. As can be seen from FIG. 5, the bonding material 11' adopting bumps or epoxy or solder paste is connected to the backside BS of the semiconductor device 50. The active circuit portion 14 is disposed on the substrate 12. The dielectric portion 19 is disposed on the active circuit portion 14. A hole 18' is formed within the dielectric portion 19 and penetrates through the dielectric portion 19. The radiating metal sheet 16 is disposed on the dielectric portion 19. Similarly, the radiating metal sheet 16 and the active circuit portion 14 are coupled through the hole 18'. In addition, the active circuit portion 14 may be connected to the PCB 13 via a hole 58 formed within the substrate 12, where the hole 58 may also be a hot via or a through-silicon via (TSV).

Figure 6:
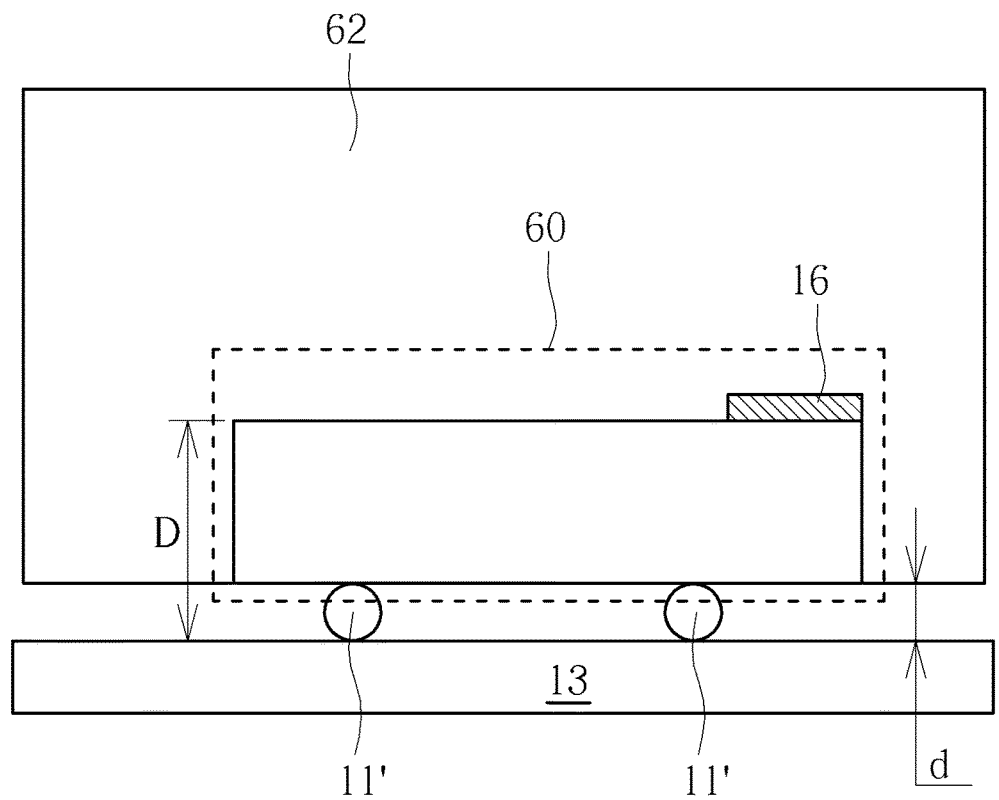
FIG. 6 is a schematic diagram of a semiconductor device according to an embodiment of the present invention.

In addition, FIG. 6 is a schematic diagram of a semiconductor device 60 according to an embodiment of the present invention. The semiconductor device 60 may be realized by the semiconductor devices 10, 20 or 50. The semiconductor device 60 is covered by a molding portion 62, to form as a semiconductor package. Notably, the radiating metal sheet 16 which realized by the semiconductor devices 10 or 20 within the semiconductor device 60 is disposed on the backside of the semiconductor device 60 when the semiconductor device 60 is assembled by the flip chip method on the PCB 13, or the radiating metal sheet 16 which realized by the semiconductor devices 50 within the semiconductor device 60 is disposed on the topside of the semiconductor device when the semiconductor device 60 is directly assembled on the PCB 13. In any case, a distance D between the radiating metal sheet 16 and the PCB 13 is larger than a distance d between the semiconductor device 60 (especially the substrate 12 therein) and the PCB 13, so as to alleviation affection caused by the PCB on the radiation performance.

In summary, the present invention utilizes forming the radiating metal sheet (antenna) disposed above the semiconductor device and a PCB to enlarge a distance between the radiating metal sheet and the PCB, so as to alleviation affection caused by the PCB on the radiation performance. In addition, the present invention utilizes the hole (e.g., HV), penetrating through the substrate or the dielectric layer, to connect the active circuit on the topside and the antenna on the backside. Therefore, the semiconductor device of the present invention would have better RF performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, wherein a hole is formed within the substrate and the hole penetrates through the substrate;
an active circuit portion, comprising at least an active component, formed on a topside of the semiconductor device; and
a radiating metal sheet, formed on a backside of the semiconductor device, configured to radiate electromagnetic wave and to function as an antenna, wherein the radiating metal sheet comprises a first radiating part and a second radiating part;
wherein the active circuit portion and the radiating metal sheet are coupled through the hole.

2. The semiconductor device of claim 1, wherein the hole is a hot via.

3. The semiconductor device of claim 1, wherein the hole is a through-silicon via (TSV).

4. The semiconductor device of claim 1, wherein the semiconductor device is disposed on a printed circuit board (PCB) using a flip chip method.

5. The semiconductor device of claim 1, wherein the semiconductor device is flipped and coupled to a printed circuit board (PCB) by using bumps or epoxy or solder paste.

6. The semiconductor device of claim 1, further comprising a dielectric portion, wherein the dielectric portion is disposed between the substrate and the radiating metal sheet, and the hole penetrates through the dielectric portion.

7. The semiconductor device of claim 1, wherein the first radiating part and the second radiating part are not connected, and the active circuit portion is only coupled to the first radiating part of the radiating metal sheet through the hole.

8. The semiconductor device of claim 1, wherein the semiconductor device is covered by a molding portion to form a semiconductor package.

\* \* \* \* \*